United States Patent
Chanemougame et al.

(10) Patent No.: US 10,374,040 B1
(45) Date of Patent: Aug. 6, 2019

(54) METHOD TO FORM LOW RESISTANCE CONTACT

(71) Applicant: GLOBALFOUNDRIES INC., Grand Cayman (KY)

(72) Inventors: Daniel Chanemougame, Niskayuna, NY (US); Lars Liebmann, Mechanicville, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/005,832

(22) Filed: Jun. 12, 2018

(51) Int. Cl.
  *H01L 29/08* (2006.01)
  *H01L 21/8234* (2006.01)
  *H01L 21/8238* (2006.01)
  *H01L 29/417* (2006.01)
  *H01L 29/06* (2006.01)
  *H01L 21/768* (2006.01)
  *H01L 23/528* (2006.01)
  *H01L 27/088* (2006.01)

(52) U.S. Cl.
  CPC .... *H01L 29/0847* (2013.01); *H01L 21/76831* (2013.01); *H01L 21/76846* (2013.01); *H01L 21/823431* (2013.01); *H01L 21/823814* (2013.01); *H01L 21/823821* (2013.01); *H01L 23/528* (2013.01); *H01L 27/0886* (2013.01); *H01L 29/0649* (2013.01); *H01L 29/41775* (2013.01)

(58) Field of Classification Search
  CPC .......... H01L 29/0847; H01L 21/76831; H01L 21/76846; H01L 21/823431; H01L 21/823814; H01L 21/823821; H01L 23/528; H01L 27/0886; H01L 29/0649; H01L 29/41775

See application file for complete search history.

(56) References Cited

U.S. PATENT DOCUMENTS

| | | | |
|---|---|---|---|
| 9,147,748 B1 * | 9/2015 | Xie | H01L 29/66545 |
| 2014/0203370 A1 * | 7/2014 | Maeda | H01L 29/785 257/365 |
| 2015/0206945 A1 * | 7/2015 | Chen | H01L 29/41783 257/384 |
| 2016/0284700 A1 * | 9/2016 | Yoon | H01L 27/0886 |
| 2017/0271462 A1 * | 9/2017 | Kim | H01L 29/41783 |
| 2017/0301590 A1 * | 10/2017 | Anderson | H01L 27/0617 |

* cited by examiner

*Primary Examiner* — Fernando L Toledo
*Assistant Examiner* — Neil R Prasad
(74) *Attorney, Agent, or Firm* — Francois Pagette; Hoffman Warnick LLC

(57) ABSTRACT

In the manufacture of a semiconductor device, electrical interconnects are formed by depositing a dielectric layer over source/drain regions, and forming a continuous trench within the dielectric layer. The trench may traverse plural source/drain regions associated with adjacent devices. The electrical interconnects are thereafter formed by metallizing the trench and patterning the metallization layers to form discrete interconnects over and in electrical contact with respective source/drain regions. The source/drain interconnects exhibit a reentrant profile, which presents a larger contact area to later-formed conductive contacts than a conventional tapered profile, and thus improve manufacturability and yield.

18 Claims, 13 Drawing Sheets

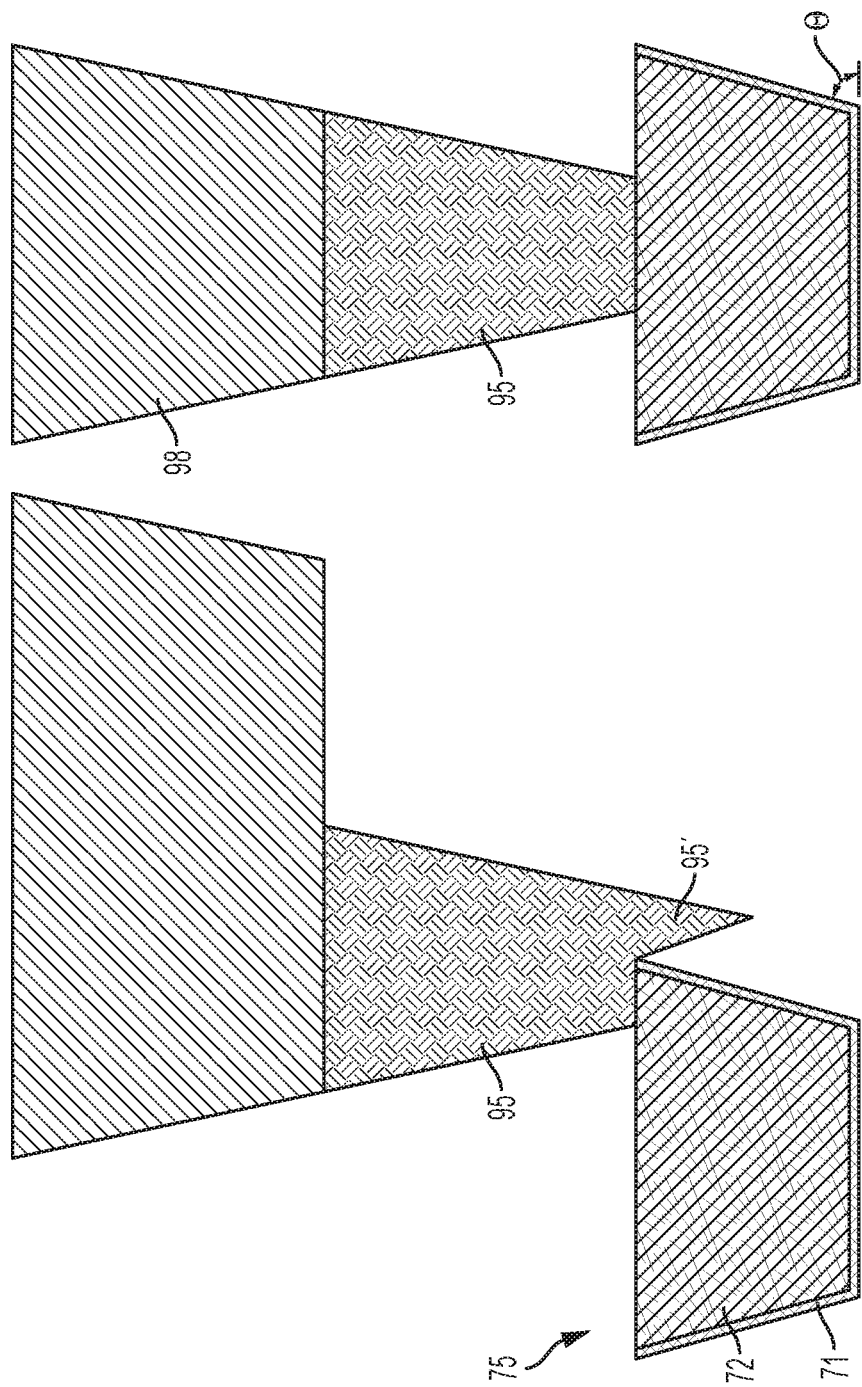

US 10,374,040 B1

METHOD TO FORM LOW RESISTANCE CONTACT

BACKGROUND

The present application relates generally to methods for forming semiconductor devices, and is particularly applicable to improving a density of features for the 14 nanometer technology node and beyond.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density pose various manufacturing challenges, including the precise alignment of middle-of-the-line (MOL) metallization structures. Large contact areas and loose enclosure rules between underlying and overlying layers of metallization facilitate ease of alignment and enable low resistance and high yield, but incur a scaling penalty.

In advanced node devices such as FinFET devices, for instance, tight enclosure rules such as between source/drain interconnects and overlying conductive contacts enable extended scaling, but are susceptible to process variability and high electrical resistance between the conductive structures, which can adversely affect yield. Notwithstanding recent developments, it would be beneficial to develop methods of forming conductive contacts that meet next-generation performance and scaling requirements.

SUMMARY

Disclosed are semiconductor device architectures and methods for fabricating semiconductor device architectures that have reliable, low resistance contacts. Middle-of-the-line (MOL) contact resistance, for example, such as between source/drain interconnects and associated metal contacts, can be decreased without an increased risk of electrical short circuits between gate contacts and source/drain contacts by forming the source/drain interconnects initially as a continuous layer that is later etched to define discrete structures. The foregoing methodology produces interconnect structures having a reentrant profile, which presents a larger contact area to later-formed contacts than a tapered profile, and thus improve manufacturability and yield.

According to various embodiments, a semiconductor device includes an active region with terminals, such as source/drain regions in a field effect transistor, and an interconnect structure disposed over and in electrical contact with the source/drain regions, wherein the interconnect structure has a reentrant profile. The semiconductor device may include a planar field effect transistor (FET), nanowire FET or FinFET, for example, although further device architectures are contemplated.

A further semiconductor device includes a source/drain region disposed over a semiconductor material layer, an interconnect structure disposed over and in electrical contact with the source/drain region, and a conductive contact in electrical contact with sidewalls as well as a top surface of the interconnect structure.

A method of forming a semiconductor device includes forming a semiconductor material layer over a semiconductor substrate, where the semiconductor material layer has alternating source/drain and channel regions, forming a metallization architecture over and extending between plural source/drain regions, and etching the metallization architecture to form an interconnect structure having a reentrant profile over at least one source/drain region. The semiconductor material layer may include a semiconductor fin, for example, or a layer of a semiconductor substrate, such as an SOI layer in a semiconductor-on-insulator substrate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 14 shows a comparative middle-of-the-line metallization architecture.

DETAILED DESCRIPTION

Figure 2:
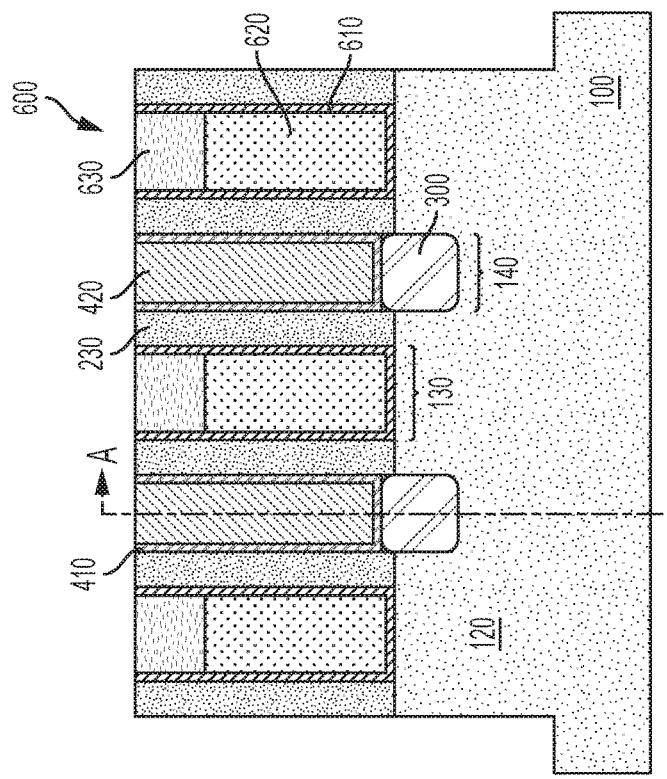
FIG. 2 shows the FinFET structure of FIG. 1 following a replacement metal gate (RMG) module and the attendant formation of functional gates over the channel regions of the fin.

Reference will now be made in greater detail to various embodiments of the subject matter of the present application, some embodiments of which are illustrated in the accompanying drawings. The same reference numerals will be used throughout the drawings to refer to the same or similar parts.

As used herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

Disclosed are methods of manufacturing semiconductor devices such as FinFET devices having improved middle-of-the-line (MOL) metallization performance and reliability. The instant methods enable manufacturable, scalable device contacts having low contact resistance.

According to various embodiments, in lieu of forming electrical interconnects to source/drain regions by depositing a dielectric layer over the source/drain regions, forming openings in the dielectric layer to expose respective source/drain regions, and metallizing the openings, electrical interconnects may be formed by depositing a dielectric layer over source/drain regions and forming a continuous trench in the dielectric layer that traverses plural source/drain regions. The electrical interconnects are thereafter formed by metallizing the trench and patterning the metallization layer(s) to form discrete interconnects over and in electrical contact with respective source/drain regions. The remaining open portions of the trench may be backfilled with a dielectric layer.

Using the present approach, the electrical interconnects have a reentrant profile that advantageously presents a consistent, larger contact area to later-formed conductive contacts than a conventional tapered interconnect.

As used here, a structure or element having a "reentrant" profile has a top or upper critical dimension (CD) that is less than a corresponding bottom or lower critical dimension, such that a sidewall angle of the structure or element with respect to the horizontal axis is greater than 90°. A structure or element having "tapered" profile, on the other hand, has a top or upper critical dimension (CD) that exceeds a bottom or lower critical dimension such that an angle between a sidewall of the structure or element and the horizontal axis is less than 90°.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

An example process for forming low resistance contacts, including source/drain interconnects having a reentrant profile, is described herein with reference to FIGS. 1-12. Although the illustrated embodiments are described with reference to a FinFET device, it will be appreciated that alternate device structures are envisioned.

Figure 1:
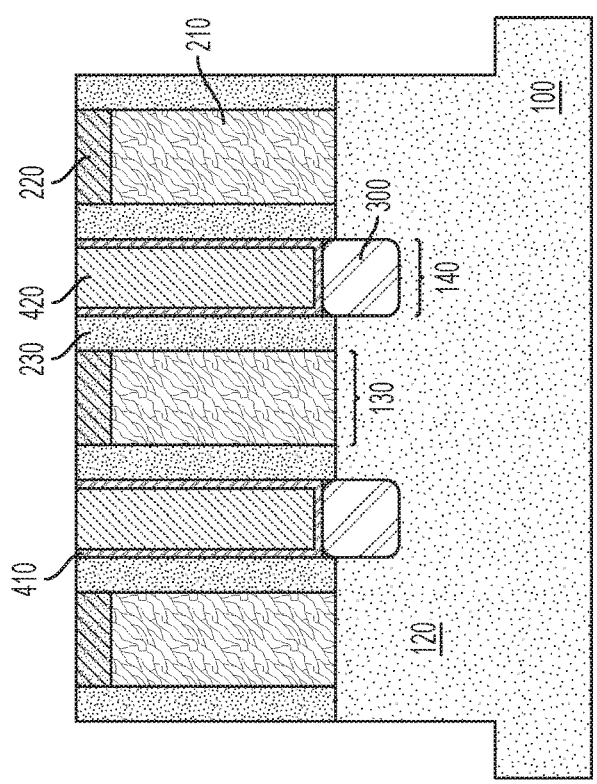
FIG. 1 is a planarized FinFET structure at an intermediate stage of fabrication following the formation of sacrificial gates over channel regions of a semiconductor fin, a spacer layer over sidewalls of the sacrificial gates, source/drain regions laterally adjacent to the channel regions, and a contact etch stop layer and dielectric fill layer between adjacent spacer layers and over the source/drain regions.

Referring to FIG. 1, a semiconductor fin 120 is formed over a semiconductor substrate 100. The semiconductor substrate 100 may be a bulk substrate or a composite substrate such as a semiconductor-on-insulator (SOI) substrate, and may include any suitable semiconductor material as known to those skilled in the art. Portions of the semiconductor substrate 100 may be amorphous, polycrystalline, or single crystalline. Although a single fin 120 is shown in the illustrated cross-section, it will be appreciated that an array of fins may be formed over the substrate.

In various embodiments, each fin 120 includes a semiconductor material such as silicon, and may be formed by patterning and then etching the semiconductor substrate 100, e.g., a top portion of the semiconductor substrate. In several embodiments, the fins 120 are etched from, and therefore are contiguous with the semiconductor substrate 100. For instance, fins 120 may be formed using a sidewall image transfer (SIT) process as known to those skilled in the art.

Each fin 120 can include a single crystal semiconductor material that extends along a lengthwise direction. As used herein, a "lengthwise direction" is a horizontal direction along which an object extends the most. A "widthwise direction" is a horizontal direction that is perpendicular to the lengthwise direction.

In certain embodiments, the fins 120 can have a width of 5 nm to 20 nm, and a height of 30 nm to 150 nm, although other dimensions are contemplated. In structures including plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. As used herein, the term "pitch" refers to the sum of the fin width and the spacing between neighboring fins.

Such plural fins are typically oriented parallel to each other and perpendicular to the library logic flow of a circuit. After fin formation, a fin cut or fin removal process may be used to eliminate unwanted fins or unwanted portions thereof for the particular circuit or device being fabricated. Thus, the fin-to-fin periodicity may be constant or variable over an array of fins.

Referring still to FIG. 1, fin 120 includes alternating channel regions 130 and source/drain regions 140 as understood by one skilled in the art. Illustrated is a replacement metal gate (RMG) structure following formation of a sacrificial gate 210 over the channel regions 130 of the fin 120. A hard mask 220 overlies the sacrificial gate 210. The sacrificial gate 210 and hard mask 220 are used to template the formation of sidewall spacers 230. An epitaxial layer 300 is then formed over the source/drain regions 140 of the fin 120 between adjacent sidewall spacers 230. Thereafter, a conformal liner 410 is formed over the sidewall spacers 230 and over thme epitaxial layers 300, and a dielectric fill layer 420 is formed directly over the conformal liner 410, i.e., within contact locations over the epitaxial layers 300 and over shallow trench isolation between adjacent fins.

The sacrificial gate 210 and overlying hard mask 220 may be formed using conventional deposition, photolithography and etching processes. The sacrificial gate 210 may include a layer of amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition.

The sacrificial gate 210 may have a height, e.g., thickness, sufficient to completely cover the fins 120. For instance, a height of sacrificial gate 210 may range from 50 to 200 nm, e.g., 50, 75, 100, 125, 150, 175 or 200 nm, including ranges between any of the foregoing values, although lesser and greater heights may be used. The hard mask 220 may include a dielectric material such as silicon nitride, and may be formed using chemical vapor deposition.

Sacrificial gate 210 is adapted to provide a temporary structure for a replacement metal gate (RMG) module that is used to form a functional gate over each channel region of the fin. As used herein, a "functional gate" refers to a structure used to control output current (i.e., the flow of carriers through a channel) of a semiconductor device using an electrical field or, in some instances, a magnetic field, and includes a gate dielectric and a gate conductor. Metallization of the functional gates and the source/drain regions may be used to form operable devices.

In the illustrated embodiment of FIG. 1, sidewall spacers 230 are disposed over sidewalls (vertical surfaces) of the sacrificial gate 210, and conformal liner 410 and dielectric fill layer 420 are disposed over the sidewall spacers 230 as well as over a top surface of the epitaxial layers 300. The conformal liner 410 is adapted to function as a contact etch stop layer (CESL).

The sidewall spacers 230 may be formed by blanket deposition of a spacer material (e.g., using atomic layer deposition) followed by a directional etch such as reactive ion etching (RIE) to remove the spacer material from horizontal surfaces. In certain embodiments, the sidewall spacer thickness is 4 to 20 nm, e.g., 4, 10, 15 or 20 nm, including ranges between any of the foregoing values.

Epitaxial layers 300 may be formed by selective epitaxy following formation of the sacrificial gate 210 and sidewall spacers 230, but prior to depositing the conformal liner 410 and the dielectric fill layer 420, e.g., using the sidewall spacers 230 as an alignment mask.

According to various embodiments, epitaxial layers 300 may include silicon (e.g., Si) or a silicon-containing material such as silicon germanium (SiGe). For instance, SiGe epitaxial layers may be incorporated into a p-MOS device to provide compressive stress to the channel, which can improve carrier mobility.

The terms "epitaxy," "epitaxial" and/or "epitaxial growth and/or deposition" refer to the formation of a semiconductor material layer on a deposition surface of a semiconductor material, in which the semiconductor material layer being grown assumes the same crystalline structure the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. Example epitaxial growth processes include low energy plasma deposition, liquid phase epitaxy, molecular beam epitaxy, and atmospheric pressure chemical vapor deposition.

The epitaxial layers 300 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

The conformal liner 410 and dielectric fill layer 420 are successively formed over the epitaxial layers 300 and over sidewall spacers 230 to fill the trench over the epitaxial layers 300, and the resulting structure is planarized, optionally using hard mask 220 as an etch stop layer.

Conformal liner 410 may be formed by blanket deposition of a suitable contact etch stop material (e.g., using CVD or atomic layer deposition). In certain embodiments, the conformal liner 410 thickness is 2 to 10 nm, e.g., 2, 4, 6, 8 or 10 nm, including ranges between any of the foregoing values.

Suitable sidewall spacer and conformal liner materials include oxides, nitrides and oxynitrides, such as silicon dioxide, silicon nitride, silicon oxynitride, and low dielectric constant (low-k) materials such as amorphous carbon, SiOC, SiOCN and SiBCN. As used herein, a "low-k" material has a dielectric constant less than that of silicon nitride.

As will be appreciated, the compounds silicon dioxide and silicon nitride have compositions that are nominally represented as $SiO_2$ and $Si_3N_4$, respectively. The terms silicon dioxide and silicon nitride, as used herein, refer to not only these stoichiometric compositions, but also to oxide and nitride compositions that deviate from the stoichiometric compositions.

In various embodiments, the sidewall spacer 230 and the conformal liner 410 are formed from materials that can be etched selectively to one another. In particular embodiments, the sidewall spacer 230 includes SiOCN and the conformal liner (i.e., contact etch stop layer) 410 includes silicon nitride, although other combinations of materials may be used.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

The dielectric fill layer 420 may include any dielectric material including, for example, oxides, nitrides or oxynitrides. In one embodiment, the dielectric fill layer 420 includes silicon dioxide. In various embodiments, the dielectric fill layer 420 may be self-planarizing, or the top surface of the dielectric fill layer 420 can be planarized by chemical mechanical polishing (CMP).

Referring to FIG. 2, hard mask 220 and sacrificial gate 210 are removed selectively with respect to the sidewall spacers 230, contact etch stop layer 410 and dielectric fill layer 420 to form gate cavity 600. A functional gate, including a gate dielectric layer 610 and a gate conductor layer 620, is then formed over channel regions 130 of the fin 120 within each gate cavity 600.

In certain embodiments, gate dielectric layer 610 includes a conformal high-k layer that is formed over the top and sidewall surfaces of the fin 120, i.e., directly over the fin 120, as well as over at least a portion of the sidewalls and the top surfaces of the sidewall spacers 230. The gate dielectric layer 610 may be formed by a conformal deposition process such as atomic layer deposition (ALD), for example.

As used herein, a "high-k" material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The thickness of the gate dielectric layer 610 may range from 1 nm to 10 nm, e.g., 1, 2, 4, 6, 8 or 10 nm, including ranges between any of the foregoing.

A gate conductor layer 620 is then formed over the gate dielectric layer 610 to substantially fill the gate cavity 600. The gate conductor 620 may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations and multilayers thereof. The gate conductor 620 may include one or more layers of such materials such as, for example, a metal stack including a work function metal layer and/or a conductive liner. In certain embodiments, the gate conductor 620 includes a titanium nitride (TiN) layer directly over the gate dielectric layer 610 and a tungsten (W) or cobalt (Co) fill layer over the titanium nitride layer.

Referring still to FIG. 2, a height of the gate conductor layer 620 within the gate cavity 600 may be decreased using a recess etch. Following the recess etch, a top surface of the gate conductor 620 is disposed below a top surface of the adjacent sidewall spacers 230 and dielectric fill layer 420. In various embodiments, a portion of the gate conductor layer 620 is removed selectively with respect to the gate dielectric layer 610.

A gate cap 630 is formed directly over the recessed gate conductor 620 and over exposed surfaces of the gate dielectric layer 610, i.e., within gate cavity 600. By way of example, the gate cap 630 may include a nitride material such as silicon nitride or silicon oxynitride (SiON). Following deposition of the gate cap material, a reactive ion etching (RIE) step or a CMP step can be used to remove the gate cap material, gate conductor layer 620 and the gate dielectric layer 610 from over top of the dielectric fill layer 420 and form a planarized structure. The polishing (or etching) step may expose the dielectric fill layer 420.

Figure 3:
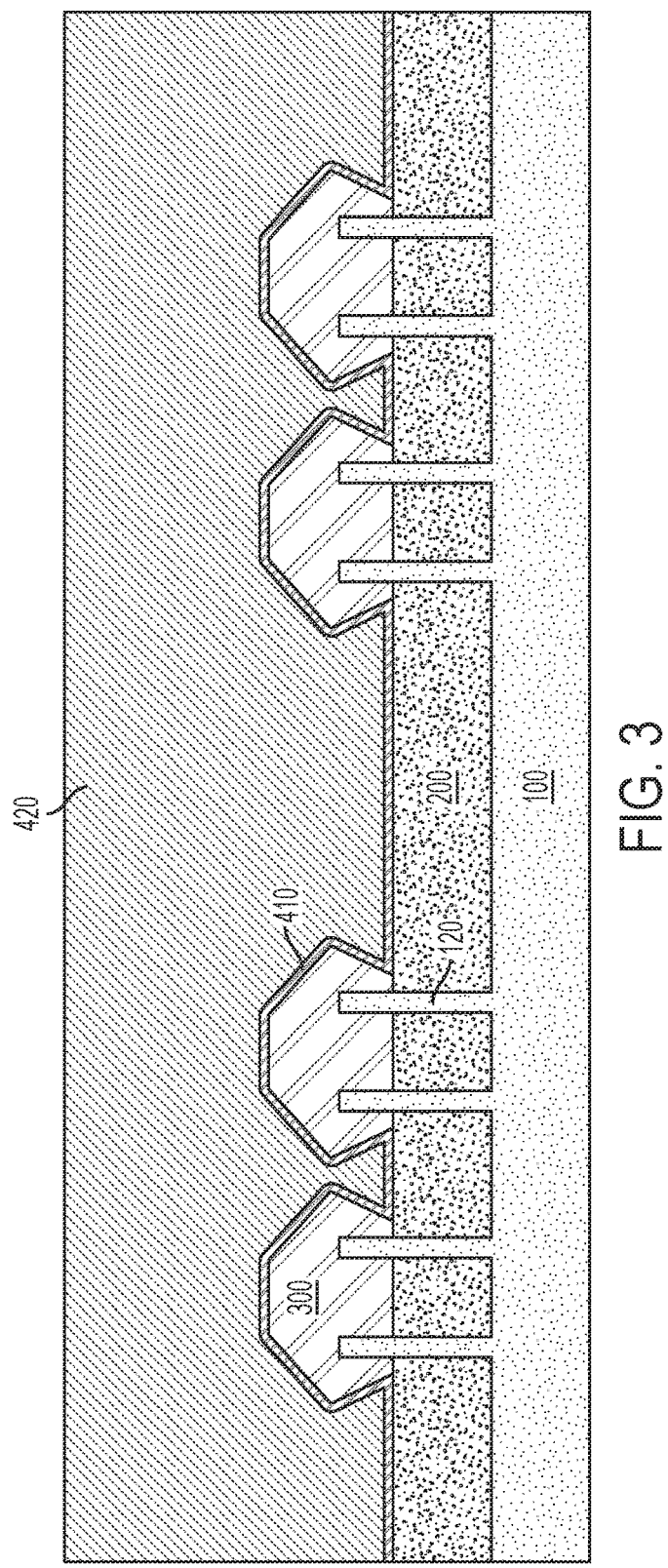
FIG. 3 is a transverse cross-sectional view along line A of FIG. 2 showing the dielectric fill layer and contact etch stop layer disposed over a plurality of adjacent fins within active and non-active regions.

FIG. 3 is a transverse cross-sectional view along line A of FIG. 2 showing the dielectric fill layer 420 and contact etch stop layer 410 disposed over active and non-active regions. That is, the dielectric fill layer 420 and contact etch stop layer 410 are disposed over epitaxial layer 300 and over a shallow trench isolation (STI) layer 200 disposed between adjacent fins 120.

Figure 4:
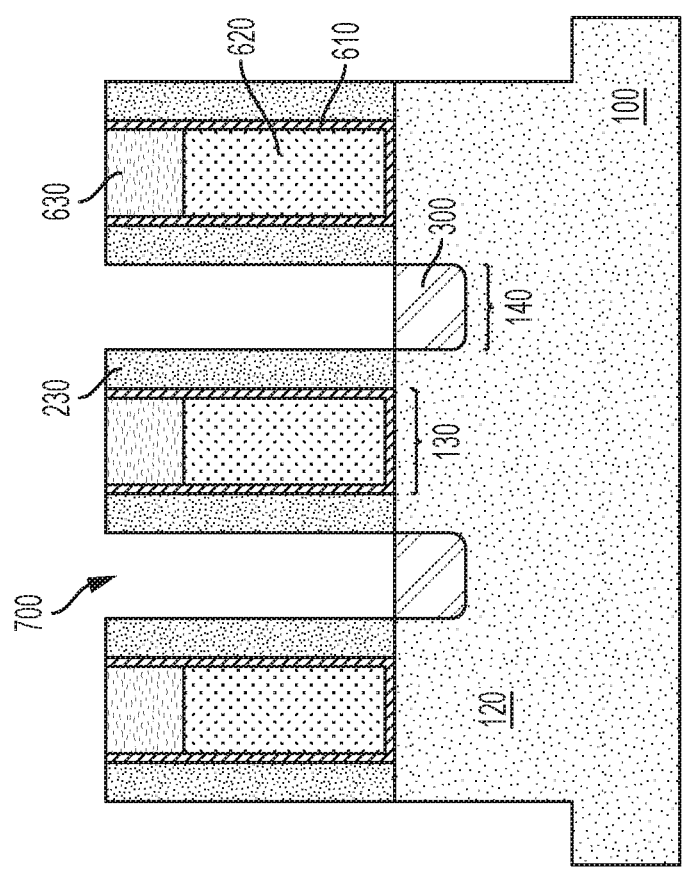
FIG. 4 depicts removal of the dielectric fill layer and contact etch stop layer from over source/drain regions of the fin to form a continuous source/drain interconnect trench.
Figure 5:
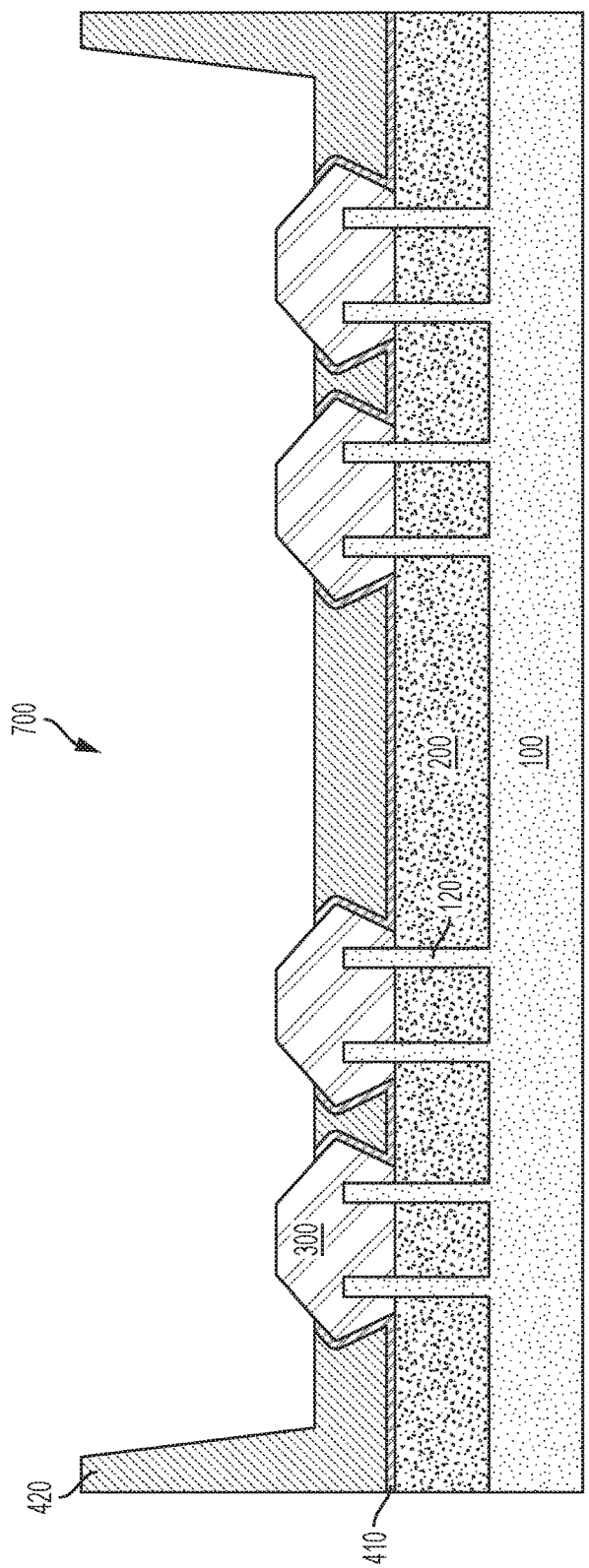
FIG. 5 depicts the formation of the source/drain interconnect trench within the dielectric fill layer extending over the source/drain regions of adjacent fins and over shallow trench isolation (STI) regions between the fins.

Referring to FIGS. 4 and 5, the dielectric fill layer 420 and the conformal liner 410 are etched to form a source/drain interconnect trench 700 that extends over both active and non-active regions. Removal of the dielectric fill layer 420 and the conformal liner 410 can be performed using one or more etch steps that are selective to the adjacent, exposed layers, including the gate cap 630 such that, in certain embodiments, the source/drain interconnect trench 700 is self-aligned to the gate. In various embodiments, the dielectric fill layer 420 and conformal liner 410 can be removed by a reactive ion etch or isotropic etch such as a wet etch or an isotropic plasma etch. An example wet etch chemistry that can be used to remove the CESL layer 410 includes phosphoric acid.

Prior to metallization of the interconnect trench 700, a wet etch can be used to remove native oxide from over the epitaxial layer 300. An example wet etch for stripping oxide includes hydrofluoric acid or a solution that includes dilute hydrofluoric acid (d-HF).

Figure 6:
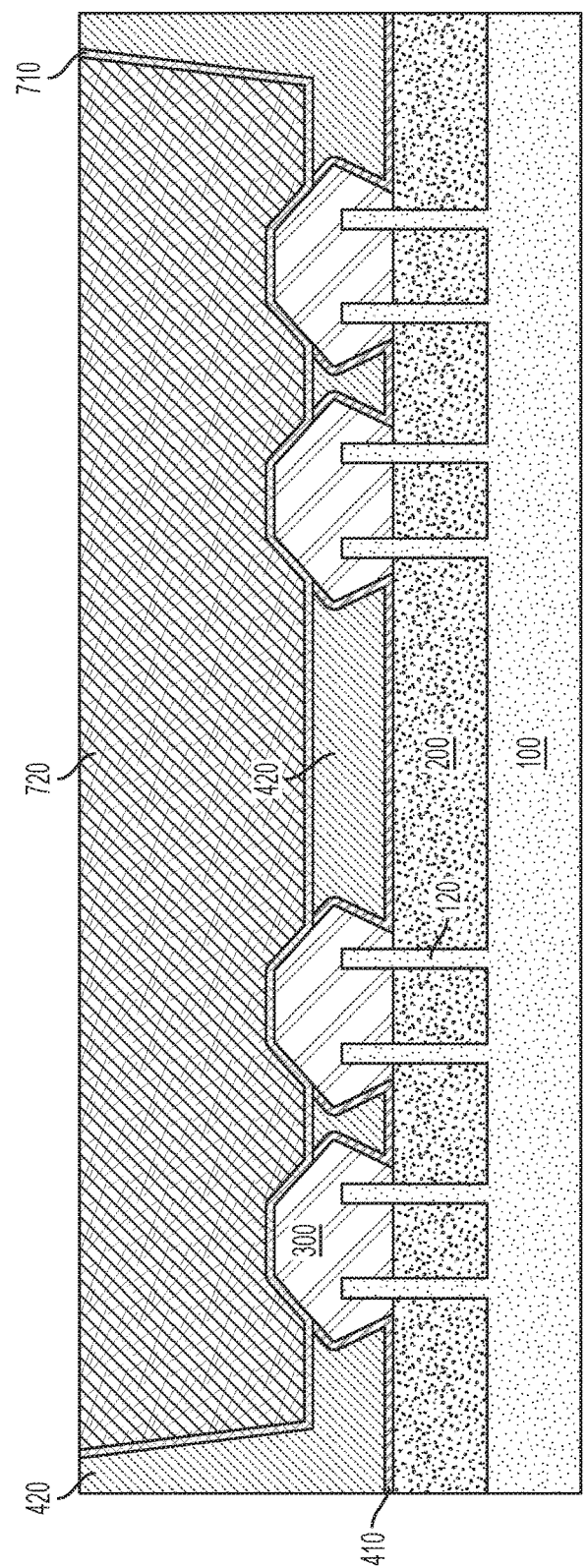
FIG. 6 shows the formation of metallization layers within the interconnect trench.

Referring to FIG. 6, a conductive liner and/or barrier layer (collectively 710) and a conductive fill layer 720 are formed successively within the interconnect trench 700, including over exposed surfaces of the epitaxial layers 300. The conductive liner may include titanium metal and the barrier layer may include titanium nitride (TiN), for example, while the conductive fill layer 720 may include a conductive material such as tungsten or cobalt.

The conductive liner and/or barrier layer 710 may include a metal that forms an ohmic contact with the epitaxial layer 300. For example, a silicide layer (e.g., titanium silicide) may be formed in situ via reaction between the conductive liner (e.g., titanium) and the epitaxial layer 300 to form a trench silicide contact.

At this stage of manufacture, the conductive liner/barrier layer 710 and conductive fill layer 720 extend as a continuous structure over plural epitaxial layers 300, as well as directly over the dielectric fill layer 420 within non-active regions between neighboring active regions. It will be appreciated that the manufacturability associated with the deposition of such a continuous metallization structure 710, 720 within interconnect trench 700 may be improved relative to the deposition of discrete interconnects within smaller trenches or vias over individual source/drain regions.

Interconnects to the epitaxial layers 300 may be formed from the conductive liner/barrier layer 710 and conductive fill layer 720 using patterning and etching processes known to those skilled in the art. The patterning and etching processes may be used to segment the metallization structure. The patterning process may include photolithography, for example, which includes forming a lithography stack 800 atop the layer(s) to be patterned. Lithography stack 800 may include a layer of photoresist. The photoresist material may include a positive-tone photoresist composition, a negative-tone photoresist composition, or a hybrid-tone photoresist composition. A layer of photoresist material may be formed by a deposition process such as, for example, spin-on coating.

Figure 7:
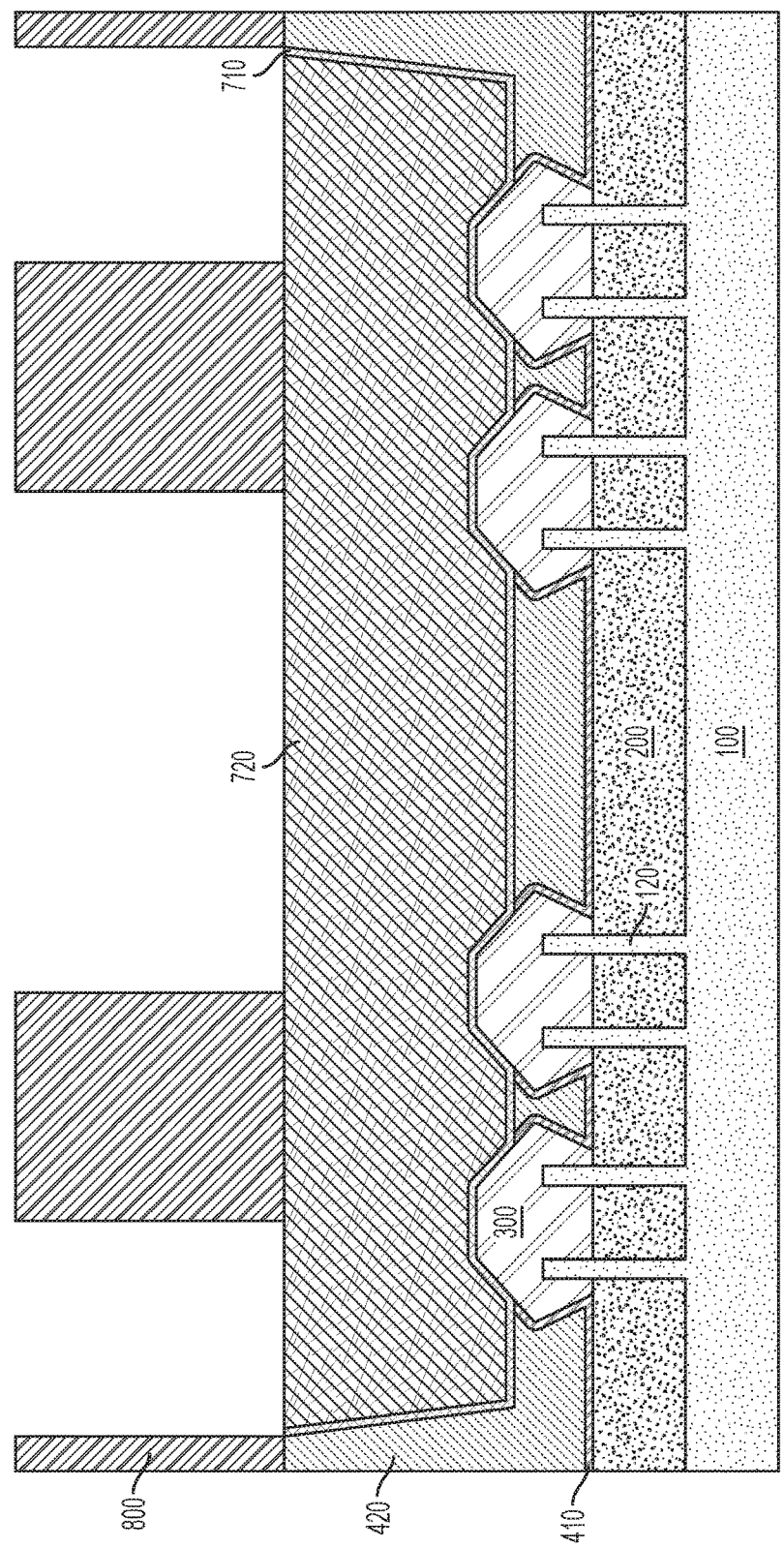
FIG. 7 shows the formation of a lithography stack over source/drain interconnect locations of the metallized interconnect trench.

As will be appreciated, and with reference to FIG. 7, the photoresist is then subjected to a pattern of irradiation, and the exposed photoresist material is developed utilizing a conventional resist developer. The pattern provided by the patterned photoresist material is thereafter transferred into the conductive liner/barrier layer 710 and the conductive fill layer 720 utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

According to various embodiments, in addition to a layer of photoresist, lithography stack 800 may include one or more of an optical planarization layer, an etch stop layer, an amorphous carbon layer, an adhesion layer, an oxide layer, and a nitride layer. Such layers may be configured as known to those skilled in the art to provide a suitable masking layer to pattern and etch the underlying layer(s).

Figure 8:
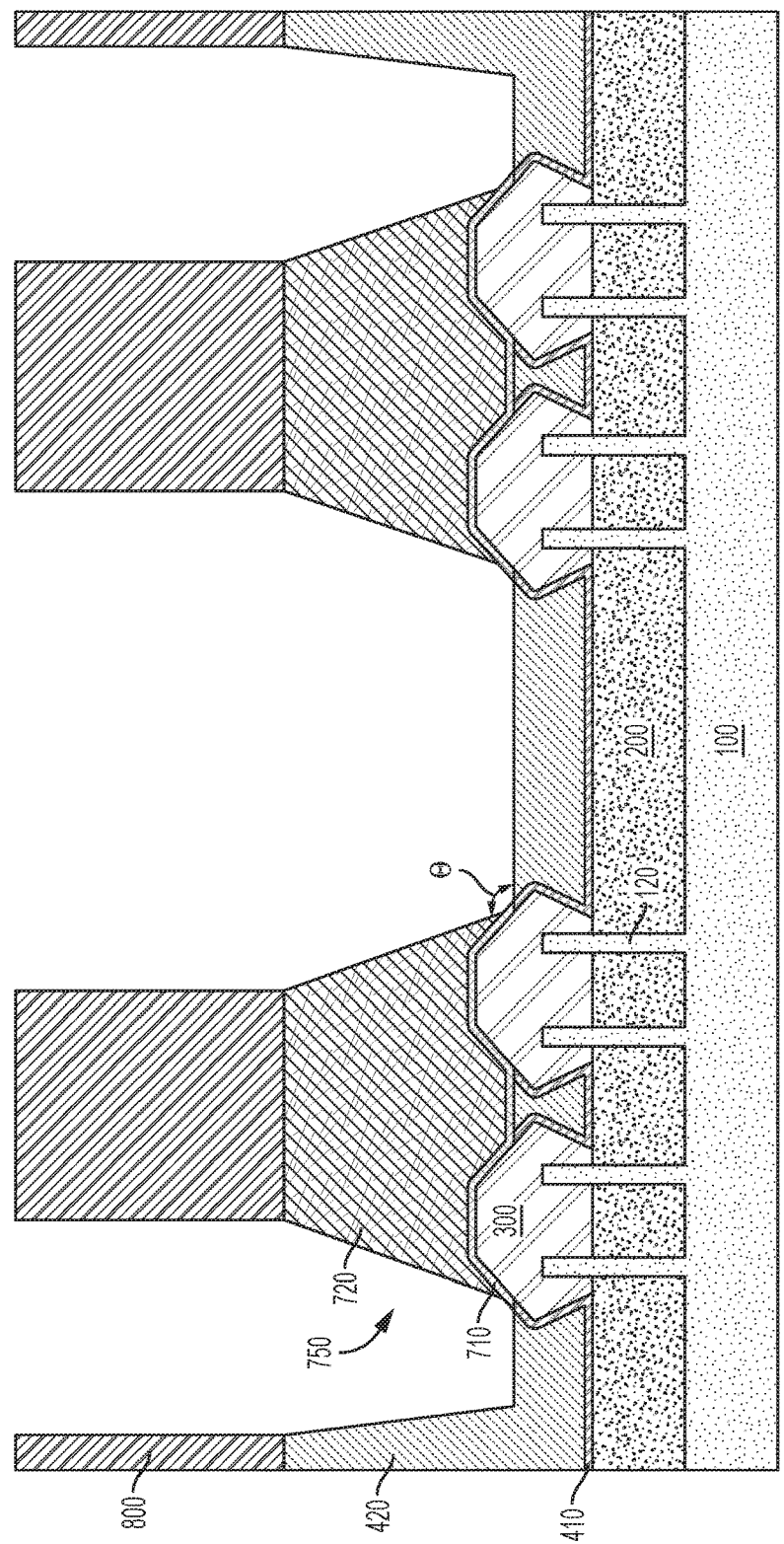
FIG. 8 shows etching of the metallization layers to form reentrant source/drain interconnects over respective source/drain regions.

Referring to FIG. 8, interconnect structures 750 disposed over epitaxial layers 300 are formed by etching unmasked portions of the conductive liner/barrier layer 710 and the conductive fill layer 720. According to various embodiments, the dimensions of the interconnect structures 750 are within lithography process windows for forming such structures, and enable the interconnect structures 750 to be defined with sloped sidewalls. Interconnect structures 750 may be characterized by a reentrant profile ($\Theta > 90°$) and include a patterned portion of the conductive fill layer 720 overlying a respective patterned portion of the conductive liner/barrier layer 710. According to various embodiments, the sidewall angle (Θ) may be 95°, 100°, 120°, 135° or 150°, including ranges between any of the foregoing values.

Figure 9:
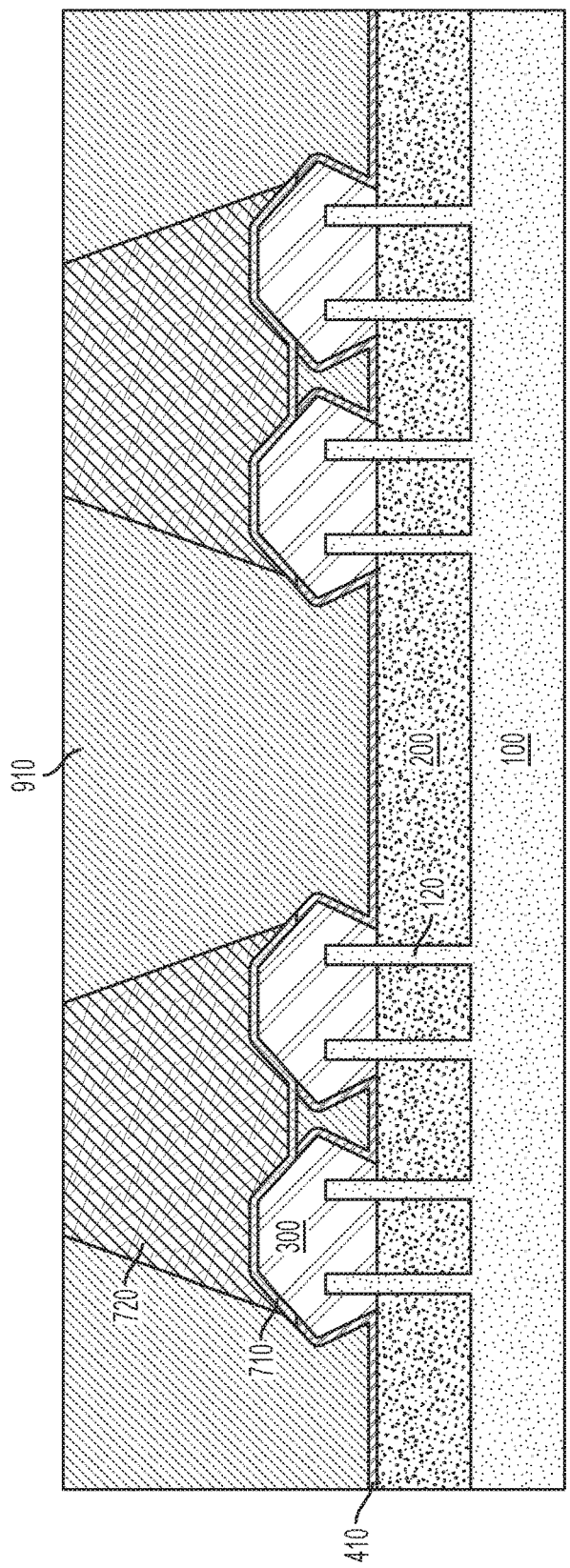
FIG. 9 is cross-sectional view showing the reentrant source/drain interconnects following the deposition and planarization of a dielectric layer to refill the interconnect trench.

Referring to FIG. 9, following removal of the remaining lithography stack, an interlayer dielectric (ILD) 910 may be deposited to refill the interconnect trench 700. A CMP step can be used to remove the overburden to form a planarized structure, e.g., using the conductive fill layer 720 as an etch stop layer. As shown in the illustrated embodiment, ILD 910 is deposited directly over the sloped sidewalls of conductive fill layer 720.

Figure 10:
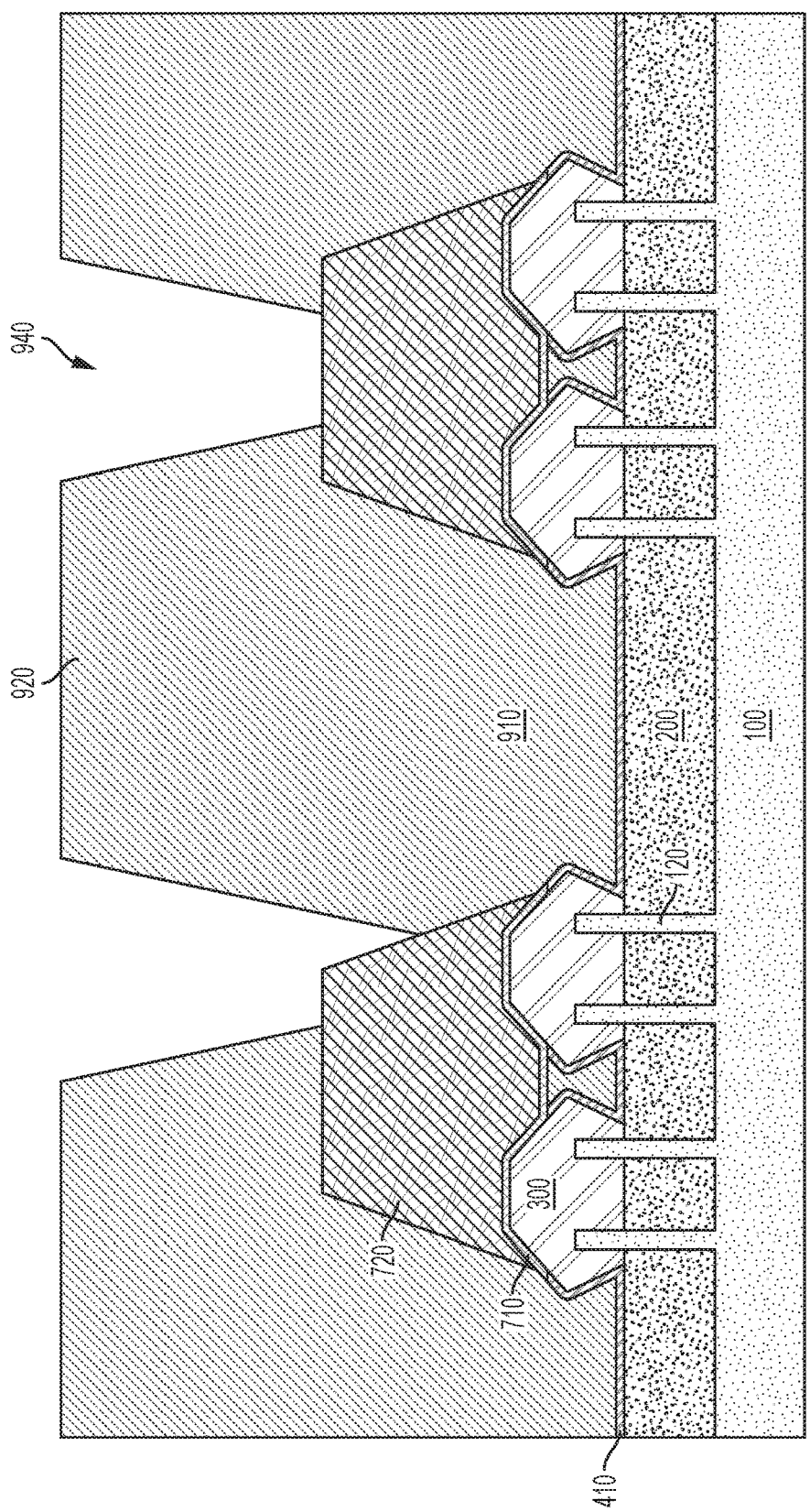
FIG. 10 shows the formation of contact openings through the dielectric layer exposing the top and sidewall surfaces of the reentrant source/drain interconnects.

Referring to FIG. 10, a further dielectric layer 920 may be formed over ILD 910 and, using conventional photolithography and etching techniques, contact openings 940 may be formed in dielectric layer 920 and optionally extending into interlayer dielectric 910 to expose conductive fill layer 720. According to various embodiments, a portion of a top surface of the conductive fill layer 720 is exposed within the contact openings 940 and, optionally, a portion of a sloped sidewall surface of the conductive fill layer 720 may be exposed as well.

Figure 11:
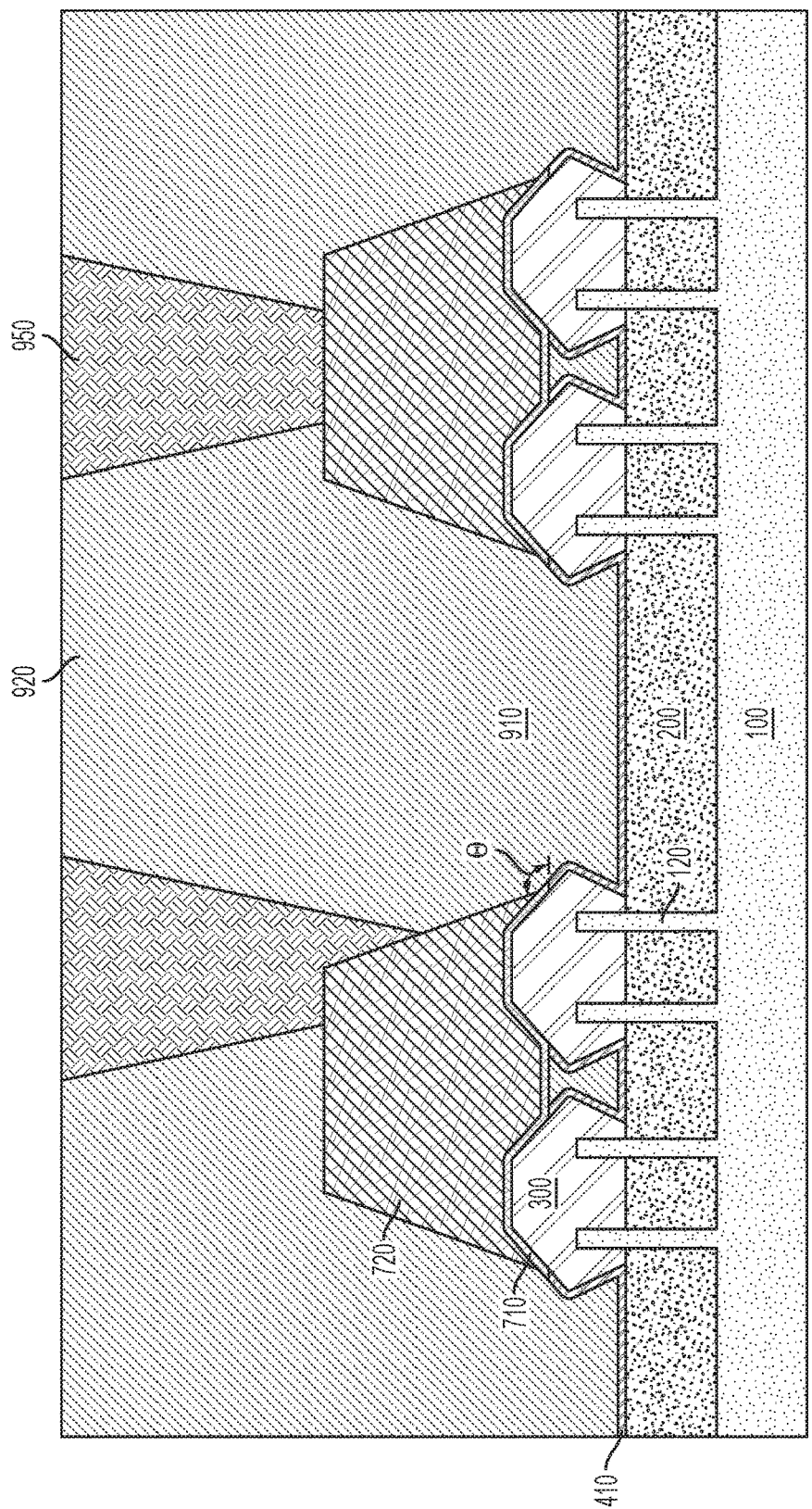
FIG. 11 shows the metallization of the contact openings according to certain embodiments.

Referring to FIG. 11, source/drain contacts 950 are formed within the contact openings 940, i.e., in electrical contact with interconnect structures 750. In certain embodiments, a source/drain contact 950 is disposed directly over a top surface of interconnect structure 750, i.e., directly over conductive fill layer 720, such that the source/drain contact 950 has a substantially planar bottom surface.

In further embodiments, a source/drain contact 950 is disposed over a top surface of an interconnect structure 750 and extends over a sloped sidewall surface of the interconnect structure 750. Thus, source/drain contact 950 may have a non-planar bottom surface, where a portion of the bottom surface of source/drain contact 950 is disposed over the top surface of conductive fill layer 720, and a further portion of the bottom surface of the source/drain contact 950 is disposed over the sloped sidewall of the conductive fill layer 720.

As will be appreciated, the absence of the conductive liner/barrier layer 710 between the source/drain contact 950 and the conductive fill layer 720 enables a lower contact resistance, which can improve the performance of the final device.

Figure 12:
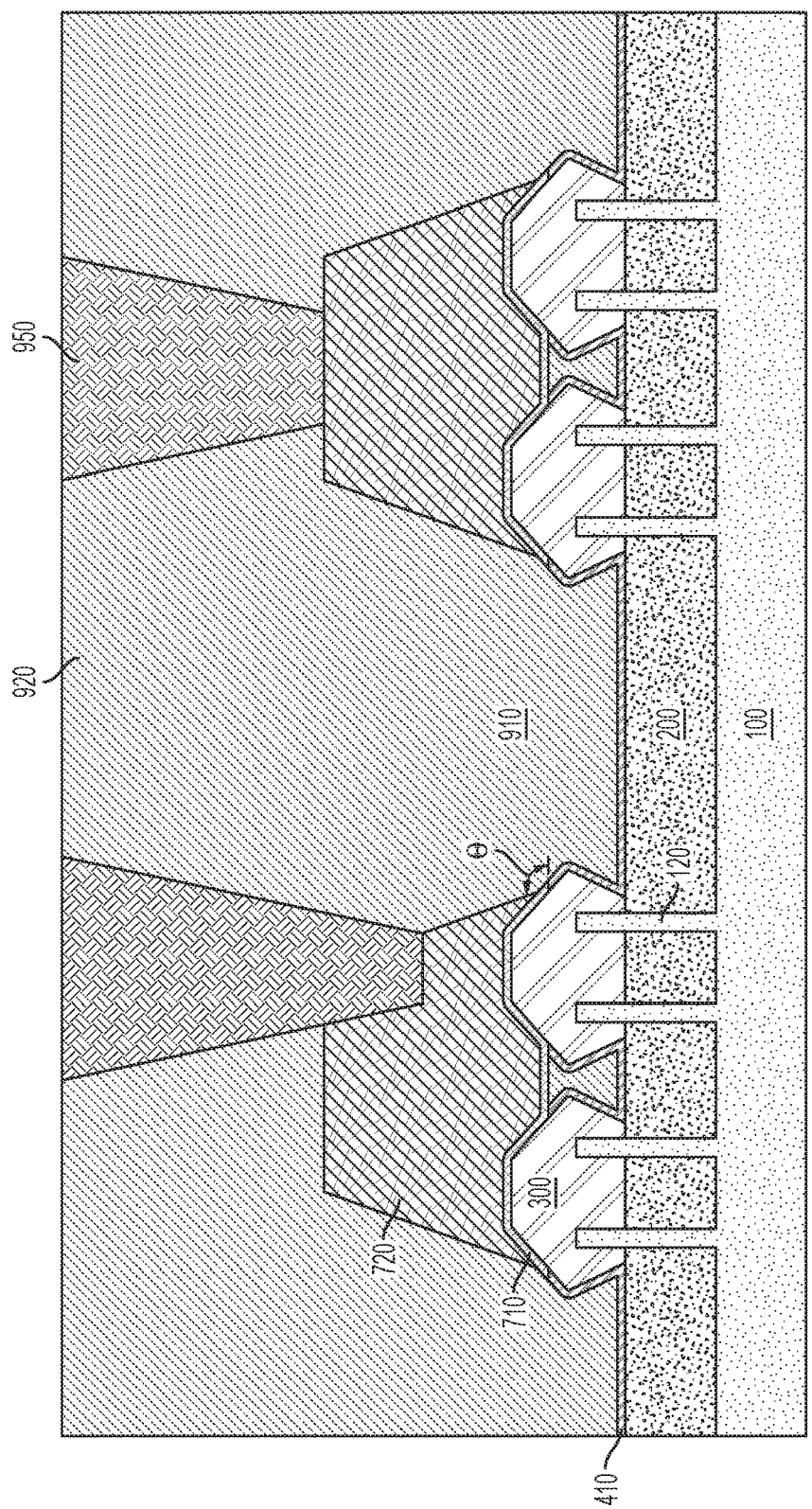
FIG. 12 shows the metallization of the contact openings according to further embodiments.

A variant to the FIG. 11 metallization architecture is shown in FIG. 12, where a portion of the interconnect structure 750, i.e., conductive fill layer 720, is intentionally removed prior and/or during formation of source/drain contact 950 to form the contact opening.

Figure 13:
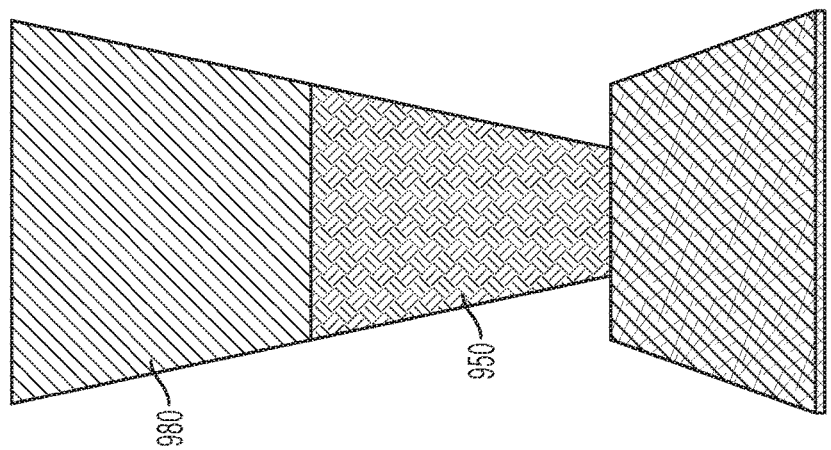
FIG. 13 shows a middle-of-the-line metallization architecture according to various embodiments.
Figure 13:
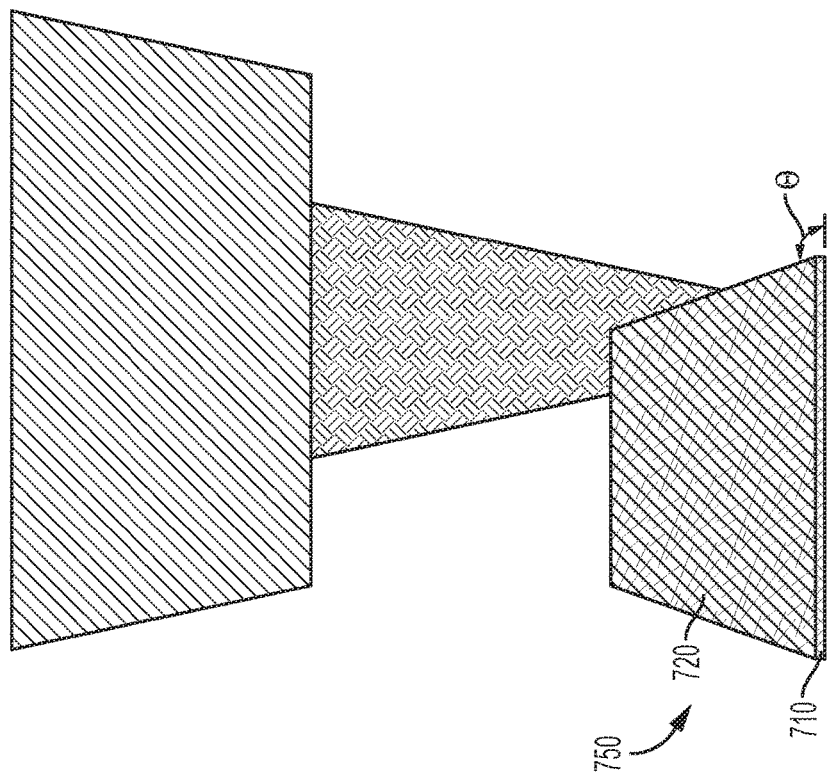

An example middle-of-the-line metallization architecture according to various embodiments is shown in the simplified schematic of FIG. 13. The metallization architecture includes a pair of reentrant interconnect structures 750 each having a conductive fill layer 720 overlying a conductive liner/barrier layer 710. The interconnect structures 750 are spaced at a tip-to-tip distance set by lithography performance, such as to meet industry reliability targets.

A source/drain conductive contact 950 is disposed over and in electrical contact with the interconnect structure 750. In one example, a conductive contact is in contact with a top surface of the underlying interconnect structure 750, and additionally extends over a sloped sidewall surface thereof. In certain embodiments, as depicted in FIG. 13, a portion of the outermost sidewall of the conductive contact 950 extends beyond the outermost sidewall of the underlying interconnect structure 750. In a further example, a conductive contact 950 is in contact with only a top surface of the underlying interconnect structure 750. A further metallization layer 980 is disposed over, and in electrical contact with the conductive contact 950.

As will be appreciated, the reentrant profile of each interconnect structure 750 enables a robust and consistent interface with conductive contact 950 despite variations in lithography. The availability of the sloped sidewalls enables the conductive contacts to be placed in close proximity to the edge of the interconnect structure 750, and decreases the extent to which the interconnect structures need to be widened in order to ensure sufficient contact area between the interconnect structure and the conductive contact. The extent to which the interconnect structures are widened at contact locations is referred to as the "enclosure" or "contact enclosure." In certain device structures, enclosure is not only provided for the width of metallization, but is also provided lengthwise in order to decrease the impact of misalignment during formation of contact openings. In particular embodiments, near-zero enclosure, zero enclosure, or even negative enclosure structures can be realized, while maintaining good electrical contact, device performance and manufacturing yield.

In contrast, a comparative metallization structure is shown in FIG. 14. The comparative structure include conductive contacts 95 disposed over interconnect structures 75 having a tapered profile. A further metallization layer 98 is disposed over the conductive contacts 95.

With a tapered profile, sidewalls of the interconnect structures 75 do not contribute to the available contact area between the interconnect structures 75 and the overlying conductive contacts 95. In a zero enclosure or even near-zero enclosure architecture, a portion 95' of the conductive contact 95 extends beyond the interconnect structure 75, which results in a decreased contact area, higher contact resistance, including the possibility of no contact formation when taking lithography variations into account.

In accordance with various embodiments, the disclosed formation and implementation of reentrant source/drain interconnects provides a robust metallization architecture having low contact resistance. Integrated circuits fabricated with the instant method may exhibit improved yield, reliability and performance, with decreased instances of circuit failure, while enabling more aggressive reduction of feature size.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a high-k layer that comprises hafnium oxide include embodiments where a high-k layer consists essentially of hafnium oxide and embodiments where a high-k layer consists of hafnium oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor device, comprising:
a source/drain region disposed over a semiconductor material layer;
an interconnect structure disposed over and in electrical contact with the source/drain region, the interconnect structure including a conductive liner disposed over the source/drain region and a conductive fill layer disposed over the conductive liner, wherein the interconnect structure has a reentrant profile in which a horizontal critical dimension in an upper portion of the interconnect structure is smaller than a horizontal critical dimension in a lower portion of the interconnect structure; and
a conductive contact disposed over the interconnect structure and in direct physical contact with at least sidewalls of the interconnect structure.

2. The semiconductor device of claim 1, wherein at least the conductive fill layer of the interconnect structure has a reentrant profile.

3. The semiconductor device of claim 2, wherein the conductive liner comprises a metal silicide.

4. The semiconductor device of claim 2, wherein sidewalls of the conductive fill layer are oriented at an angle of between 90° and 150° with respect to a top surface of the semiconductor material layer external to the conductive fill layer.

5. The semiconductor device of claim 2, further comprising a dielectric layer disposed directly over sidewalls of the conductive fill layer.

6. The semiconductor device of claim 1, further comprising a dielectric layer disposed over the interconnect structure.

7. The semiconductor device of claim 6, further comprising a conductive contact extending through the dielectric layer and in electrical contact with the interconnect structure.

8. The semiconductor device of claim 1, wherein the conductive contact is in electrical contact with sidewalls of the conductive fill layer.

9. The semiconductor device of claim 1, wherein the conductive contact is in electrical contact with sidewalls and a top surface of the conductive fill layer.

10. A semiconductor device, comprising:
a source/drain region disposed over a semiconductor material layer;
an interconnect structure disposed over and in electrical contact with the source/drain region, the interconnect structure including a conductive liner disposed over the source/drain region and a conductive fill layer disposed over the conductive liner, wherein the interconnect structure has a reentrant profile in which a horizontal critical dimension in an upper portion of the interconnect structure is smaller than a horizontal critical dimension in a lower portion of the interconnect structure by virtue of a width of the conductive fill layer being smaller at an upper portion of the conductive fill layer than the width is at a lower portion of the conductive fill layer; and
a conductive contact in electrical contact with sidewalls and a top surface of the interconnect structure.

11. The semiconductor device of claim 10, where a portion of an outermost sidewall of the conductive contact extends beyond an outermost sidewall of the interconnect structure and another portion of the outermost sidewall of the conductive contact extends below the top surface of the conductive fill layer to extend along and engage a portion of at least one sidewall of the conductive fill layer.

12. A method of forming a semiconductor device, comprising:
forming a semiconductor material layer over a semiconductor substrate, the semiconductor material layer having alternating source/drain and channel regions;
forming a metallization architecture over and extending between plural source/drain regions;
patterning and etching the metallization architecture to form an interconnect structure over at least one source/drain region, including:
forming a conductive liner of the interconnect structure over the at least one source/drain region; and
forming a conductive fill layer of the interconnect structure over the conductive liner and with a reentrant profile in which an external sidewall of the conductive fill layer forms an angle with a horizontal surface external of the conductive fill layer of between 90° and 150°; and
forming a dielectric layer over the interconnect structure;
forming a contact opening from the top of the dielectric layer to expose a portion of the conductive fill layer; and
forming a conductive contact in the opening such that the conductive contact extends from a top surface of the dielectric layer to make direct contact with the exposed portion of the conductive fill layer.

13. The method of claim 12, wherein the exposed portion includes a top surface of the conductive fill layer of the interconnect structure.

14. The method of claim 12, wherein the exposed portion includes an external sidewall of the conductive fill layer extending below a top surface of the conductive fill layer.

15. The method of claim 12, wherein forming the metallization architecture comprises forming a dielectric layer over the source/drain regions and forming an interconnect trench in the dielectric layer.

16. The method of claim 12, wherein the metallization architecture extends over a shallow trench isolation layer between adjacent source/drain regions.

17. The method of claim 12, further comprising forming a dielectric layer between the interconnect structures.

18. The method of claim 12, wherein forming the contact opening includes recessing the conductive fill layer so that the contact opening extends through a portion of the conductive fill layer and the exposed portion includes a horizontal surface extending from an external sidewall of the conductive fill layer below a top surface of the conductive fill layer.

* * * * *